United States Patent
Cusin et al.

(10) Patent No.: US 11,334,025 B2
(45) Date of Patent: May 17, 2022

(54) COLOURED THERMOCOMPENSATED SPIRAL AND A METHOD FOR THE PRODUCTION THEREOF

(71) Applicant: Nivarox-FAR S.A., Le Locle (CH)

(72) Inventors: Pierre Cusin, Villars-Burquin (CH); Alex Gandelhman, Neuchatel (CH); Anguel Kostadinov, Dombresson (CH)

(73) Assignee: Nivarox-FAR S.A., Le Locle (CH)

( * ) Notice: Subject to any disclaimer, the term of this patent is extended or adjusted under 35 U.S.C. 154(b) by 477 days.

(21) Appl. No.: 16/522,206

(22) Filed: Jul. 25, 2019

(65) Prior Publication Data

US 2020/0050148 A1    Feb. 13, 2020

(30) Foreign Application Priority Data

Aug. 8, 2018 (EP) .................. 18188067

(51) Int. Cl.
*G04B 17/06* (2006.01)
*G04B 1/14* (2006.01)
(Continued)

(52) U.S. Cl.
CPC .............. *G04B 1/145* (2013.01); *C23C 16/04* (2013.01); *C23C 16/402* (2013.01); *G04B 17/066* (2013.01); *G04B 17/32* (2013.01)

(58) Field of Classification Search
CPC ...... G04B 1/145; G04B 17/066; G04B 17/32; G04B 1/14; G04B 17/06; C23C 16/04; C23C 16/402

See application file for complete search history.

(56) References Cited

U.S. PATENT DOCUMENTS 4,887,886 A * 12/1989 Shimizu ................ C23C 14/025
359/589
5,502,595 A * 3/1996 Kuo ........................ G02B 5/285
359/586
(Continued)

FOREIGN PATENT DOCUMENTS

CH 709 628 A2 10/2015
CN 1896290 A 1/2007
(Continued)

OTHER PUBLICATIONS

Combined Chinese Office Action and Search Report dated Oct. 23, 2020 in corresponding Chinese Patent Application No. 201910725629. 5, (with English translation of Category of Cited Documents), 7 pages.

(Continued)

*Primary Examiner* — Sean Kayes
(74) *Attorney, Agent, or Firm* — Oblon, McClelland, Maier & Neustadt, L.L.P.

(57) ABSTRACT

A method for producing a thermocompensated and coloured coil spring including the steps of forming a first layer of silicon oxide on at least one face of the core and on at least one other face of the core, the first layer having a thickness equal to a fraction of the thickness required for achieving thermal compensation, removing the first layer from at least one face of the core, forming a second layer of silicon oxide on at least one face of the core and on at least one other face of the core, the second layer having a thickness equal to the remaining fraction of the thickness required for achieving (Continued)

thermal compensation which is lower than or equal to 1 μm for giving at least one face of the core a colour as a result of the interference effect.

11 Claims, 1 Drawing Sheet

(51) Int. Cl.
  *C23C 16/04* (2006.01)
  *C23C 16/40* (2006.01)
  *G04B 17/32* (2006.01)

(56) References Cited

U.S. PATENT DOCUMENTS

| | | | |
|---|---|---|---|
| 9,188,958 B2* | 11/2015 | Hessler | G04B 17/06 |
| 2007/0140065 A1 | 6/2007 | Levingston | |
| 2010/0290320 A1 | 11/2010 | Gygax et al. | |
| 2015/0185701 A1 | 7/2015 | Tobenas Borron | |
| 2015/0261187 A1* | 9/2015 | Hessler | G04B 17/06 |
| | | | 368/170 |
| 2016/0238994 A1* | 8/2016 | Ching | C30B 29/06 |

FOREIGN PATENT DOCUMENTS

| | | |
|---|---|---|
| CN | 1977190 A | 6/2007 |
| CN | 102474204 A | 5/2012 |
| CN | 104704431 A | 6/2015 |
| CN | 106435485 A | 2/2017 |
| DE | 602007013123 | 4/2011 |
| GB | 0324439 | 11/2003 |
| WO | WO 2014/006229 A1 | 1/2014 |

OTHER PUBLICATIONS

Korean Office Action dated Oct. 29, 2020 in Korean Patent Application No. 10-2019-0090744 (with English translation), 6 pages.

European Search Report dated Feb. 12, 2019 in European Application 18188067.5, filed on Aug. 8, 2018 (with English Translation of Categories of Cited Documents).

Japanese Office Action dated Aug. 4, 2020 in Japanese Patent Application No. 2019-144209 (with English translation), 3 pages.

* cited by examiner

COLOURED THERMOCOMPENSATED SPIRAL AND A METHOD FOR THE PRODUCTION THEREOF

CROSS-REFERENCE TO RELATED APPLICATION

This application claims priority to European Patent Application No. 18188067.5 filed on Aug. 8, 2018, the entire disclosure of which is hereby incorporated herein by reference.

TECHNICAL FIELD

The present invention relates to a coil spring designed to provide a regulating element of a mechanical watch.

PRIOR ART

The value of a mechanical watchmaking piece is often relative to the visibility of its components. In this regard, skeleton watches are highly valued by customers who can see the elements and the main functions of the complex objects that they comprise. The display of the coil spring which is the source of the movement is particularly appreciated. Therefore, special attention needs to be given to the aesthetic appearance of this component.

Colouring is one way of improving the aesthetic appearance of a component. Generally, watchmaking components can be coloured by various methods for depositing layers such as PVD, ALD, galvanic processes, anodisation, etc. However, in the particular case of coil springs the deposition of such aesthetic layers is not compatible with the specifications for this part, as it needs to be insensitive to magnetic fields and behave together with the pendulum in a way that ensures that there is a minimum difference in operation at different temperatures.

SUMMARY OF THE INVENTION

Thus the subject-matter of the present invention is a proposal for a method for producing a coil spring which enables the visible surface of the coil spring to be coloured and at the same time guarantees the specifications of the base (adjustment of stiffness, antimagnetic, compensation of thermal variations of the sprung balance assembly, etc.).

For this purpose, the method of production consists of forming a thin film on at least one face of the core of the coil spring creating a colour on said face as the result of an interference effect. The film is a silicon oxide ($SiO_2$) film which contributes with other faces covered by a thicker layer of silicon oxide to the thermal compensation of the coil spring. By adjusting the thickness of the film a large selection of colours can be obtained.

More specifically, the method consists of increasing the layer of silicon oxide in several steps with:
- a first step consisting of forming a first layer of silicon oxide on all of the faces of the core, said first oxide later having a thickness which is equal to a fraction of the thickness required for forming the thermocompensated coil spring,
- a second step consisting of removing the first previously formed oxide layer from the face(s) of the core designed to be coloured,
- a third step consisting of forming a second layer of silicon oxide on the same faces as those of the first step, said second layer having a thickness which is equal to the remaining fraction of the required thickness which is less than or equal to 1 µm to give the face or faces a colour as a result of the interference effect.

Preferably, the thermal compensation layer is formed on the lateral faces of the core and on the face opposite the one designed to be visible inside the watchmaking piece.

This method has the advantage that the formation of the coloured layer has little impact on the method of production of the coil spring and on the functioning of the latter. More precisely, the formation of the thermal compensation layer on the lateral faces of the coil spring taking into consideration good behaviour at temperature is not affected or is only minimally affected by the method.

Other features and advantages of the present invention are given in the following description of a preferred embodiment, given by way of example and without any restriction, with reference to the attached drawings.

BRIEF DESCRIPTION OF THE FIGURES

FIG. 1b is a transverse cross-section of a loop of the coil spring of FIG. 1a.

DETAILED DESCRIPTION

The present invention describes a method for producing a watchmaking component which enables the visible surface to be coloured.

Figure 1A:
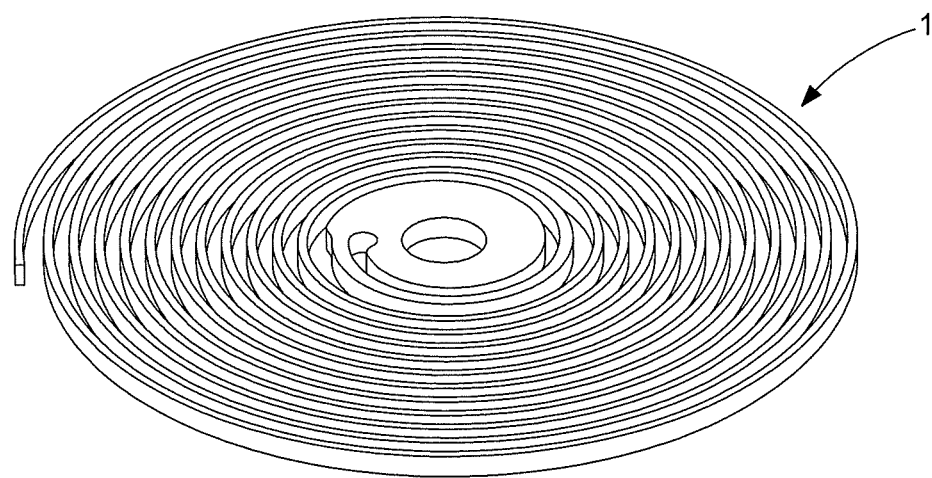
FIG. 1a is a perspective view of a coil spring according to the invention.
Figure 1B:
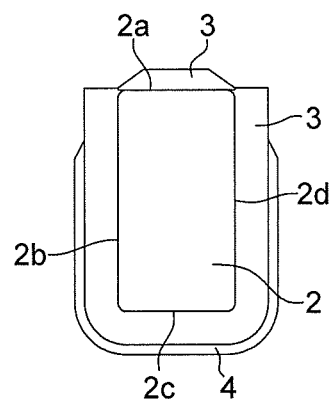

The invention is described here by way of the simplified and non-restrictive example of a coil spring 1 as represented in FIGS. 1a and 1b, and it is of course possible to produce other components according to the invention.

The invention describes a thermocompensated coil spring having, for this purpose, a monocrystalline or polycrystalline silicon core 2 covered by a layer of silicon oxide 3 which makes it possible to adjust the variation of the thermoelastic coefficient of the coil spring as a function of the behaviour of the whole coil balance (FIG. 1b). According to the invention, at least one face of the core designed to be visible after assembly inside the watch case comprises a layer of silicon oxide which is coloured as a result of the interference effect, the layer being referred to as an interference layer. In the example shown, the face 2a is the upper face of the coil spring designed to be visible through the glass of the watch case. In one variant, this could be the lower face 2c designed to be visible through the base of the watch. In another variant, the upper face 2a and the lower face 2c could comprise an interference layer. The interference layer is in the form of a thin film having a thickness which is less than or equal to 1 µm which is adjusted to the desired colour, this thickness range making it possible to obtain stronger colours (more vivid?) which are therefore more easily visible. For example, table 1 shows some examples of colours which can be obtained by interference as a function of the thickness of the film.

TABLE 1

| Thickness (Å) | Colour |
| --- | --- |
| 500 | Russet brown |
| 700 | Brown |
| 3100 | Blue |

TABLE 1-continued

| Thickness (Å) | Colour |
|---|---|
| 3900 | Yellow |
| 4700 | Violet |
| 5200 | Green |
| 6300 | Violet-red |
| 8200 | Salmon |
| 9900 | Orange |

One or more of the faces that are not covered by the thin film are covered with a thermal compensation layer also made of silicon oxide. Preferably, the coil spring comprises at least one thermal compensation layer on the lateral faces 2b, 2d of the core 2. More preferably, the core comprises a thermal compensation layer on three of the four faces of the section, namely in the illustrated example, on its lateral faces 2b, 2d and its lower face 2c. The thermal compensation layer differs from the interference layer in its thickness which is greater than that of the interference layer and more precisely greater than 1 μm. It is specified however that the interference layer is partly involved in the thermal compensation of the coil spring.

Furthermore, the coil spring can comprise a conductive layer 4 over all or a portion of the faces comprising the thermal compensation layer. In the illustrated example, a continuous conductive layer 4 covers the lower face 2c and partly the lateral faces 2b, 2d. The conductive layer may be formed for example by a metal material such as gold, platinum, chromium, tantalum, titanium, rhodium or palladium with a thickness preferably lower than 50 nm. Said conductive layer has an antistatic function and ensures a partial seal.

Figure 2:
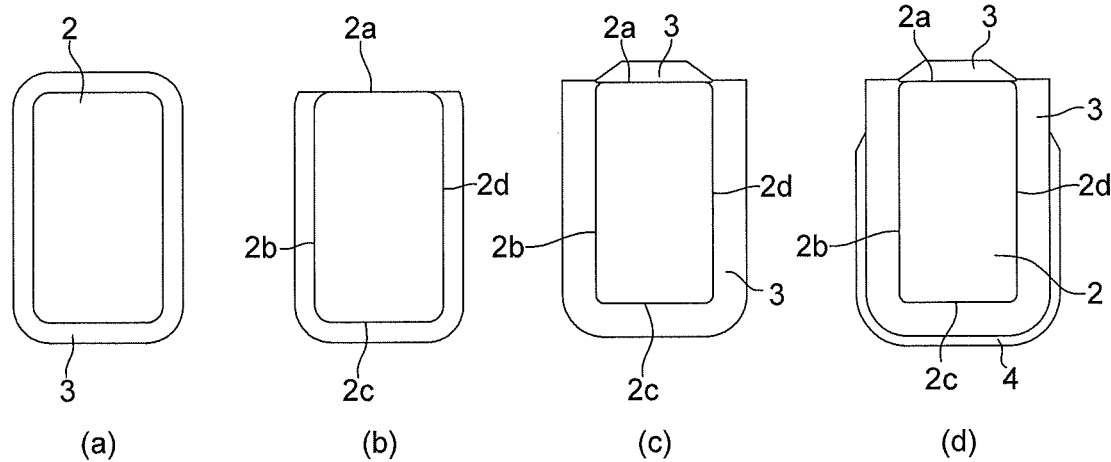
FIG. 2 shows schematically the different steps of the method according to the invention by means of transverse cross-sections of a loop of the coil spring.

The method used to produce the thermocompensated and coloured coil spring is partially illustrated in FIG. 2 by cross-sectional views of a loop of the coil spring. In this figure, the different steps carried out during the growth of silicon oxide are represented. Beforehand, the coil spring with its silicon core can be obtained from a silicon chip (wafer method). In a known manner, it is possible for example to perform a chemical attack by means of a wet process, a dry machining process by plasma or reactive ionic etching (RIE) by using appropriate masks for the desired contour of the coil.

The invention consists of replacing the conventional process of oxidation designed to form the thermal compensation layer with a series of sequences as follows. The method is described in the following for a core 2 comprising a compensation layer on its lateral face 2b, 2d and on its lower face 2c and an interference layer on its upper face 2a.

With reference to FIG. 2a, a first step consists of growing a layer of silicon oxide 3 on the silicon core 2 which layer has a thickness which is a fraction of the thickness required for obtaining thermal compensation. This step can be performed for example by thermal oxidation. In a second step shown in FIG. 2b, the oxide layer which has grown on the upper face 2a is completely removed. The removal of the oxide layer can be performed by engraving. The engraving is anisotropic, i.e. directional, with the aim of only affecting the face in question. In other words the layer 3 on the lateral faces 2b, 2d and the lower face 2c is not affected by the engraving. The method can consist of dry engraving.

A third step illustrated in FIG. 2c consists of growing a layer of silicon oxide on all of the faces 2a, 2b, 2c and 2d so as to obtain the desired thickness of the interference layer and the desired thickness for the thermal compensation layer. This step can also be performed by thermal oxidation.

Optionally in a fourth step (FIG. 2d), the conductive layer 4 is deposited on the lower face 2c and on all or part of the lateral faces 2b and 2d. This deposition can be performed by various known processes such as PVD, ionic implantation or electrolytic deposition.

In the end, the coil spring thus has a continuous layer of $SiO_2$ on all of the faces of the core 2 with a layer on the lateral faces 2b, 2c and 2d which is adjusted for thermal compensation and a layer on the upper face 2a which is adjusted to obtain the desired colour, the thickness of the layer that enables thermal compensation being greater than the thickness of the coloured layer.

Of course, such a method is not limited to a thermocompensated coil spring and can be applied to a gearwheel, an anchor or any other component made of silicon.

The invention claimed is:

1. A method for producing a thermocompensated and coloured coil spring for a watchmaking piece, said method comprising the successive steps of:
    a) providing a coil spring comprising a silicon core,
    b) forming a first layer of silicon oxide on all of the faces of the core of the coil spring, the first layer having a thickness which is equal to a fraction of the thickness required for achieving thermal compensation,
    c) removing the first layer of silicon oxide from one face of the core designed to be coloured as a result of an interference effect,
    d) forming a second layer of silicon oxide on the face of the core designed to be coloured as a result of the interference effect and on other faces of the core designed to ensure thermal compensation, the second layer of silicon oxide having a predetermined thickness for achieving thermal compensation and also giving the face of the core a colour as a result of the interference effect.

2. A thermocompensated and coloured coil spring for a watchmaking piece comprising a silicon core, wherein the core comprises:
    an interference layer of a silicon oxide on a face designed to be visible after assembly inside the watchmaking piece, the interference layer having a thickness that is lower than or equal to 1 μm, giving said at least one face a colour as a result of an interference effect,
    on the other faces a thermal compensation layer of silicon oxide, the thermal compensation layer having a thickness that is greater than that of the interference layer.

3. The method according to claim 1, wherein the thickness of the second layer of silicon oxide is adjusted to the desired colour.

4. The method according to claim 1, wherein the first and second layers of silicon oxide are formed by thermal oxidation in steps b) and d).

5. The method according to claim 1, wherein step c) is performed by anisotropic engraving.

6. The method according to claim 1, further comprising a step e) subsequent to step d) consisting of depositing a conductive layer over all or part of said at least other face of the core designed to ensure thermal compensation.

7. A method according to claim 1, wherein the first and second layers of silicon oxide are formed on all of the faces of the core, the first layer of silicon oxide being removed in step c) on a face designed to be visible from the outside of the watchmaking piece.

8. A watchmaking piece comprising the coil spring according to claim 2.

9. A coil spring according to claim 2, wherein the core comprises the interference layer on an upper face and/or a lower face and the thermal compensation layer on its two lateral faces.

10. The coil spring according to claim 9, wherein the core comprises the thermal compensation layer on its two lateral faces and on its upper face or its lower face.

11. The coil spring according to claim 8, further comprising a conductive layer covering all or part of the thermal compensation layer.

* * * * *